(12) United States Patent
Sasaki et al.

(10) Patent No.: US 7,679,199 B2
(45) Date of Patent: Mar. 16, 2010

(54) SEMICONDUCTOR APPARATUS

(75) Inventors: Kou Sasaki, Kanagawa (JP); Takashi Yonezawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 17 days.

(21) Appl. No.: 12/222,647

(22) Filed: Aug. 13, 2008

(65) Prior Publication Data

US 2009/0057926 A1  Mar. 5, 2009

(30) Foreign Application Priority Data

Aug. 28, 2007  (JP) .............................. 2007/221427

(51) Int. Cl.
*H01L 23/52* (2006.01)
(52) U.S. Cl. ................ 257/777; 257/784; 257/E23.141
(58) Field of Classification Search ................ 257/777, 257/784, E23.141
See application file for complete search history.

(56) References Cited

U.S. PATENT DOCUMENTS 7,247,921 B2   7/2007   Sugiura et al.

2005/0212147 A1   9/2005   Nishizawa
2005/0275076 A1   12/2005   Sugiura
2009/0057925 A1*  3/2009   Sasaki ...................... 257/784

FOREIGN PATENT DOCUMENTS

| JP | 6-244254 | 9/1994 |
| JP | 2005-277338 | 10/2005 |
| JP | 2005-353815 | 12/2005 |

* cited by examiner

*Primary Examiner*—Roy K Potter
(74) *Attorney, Agent, or Firm*—McGinn IP Law Group, PLLC

(57) ABSTRACT

A semiconductor apparatus capable of simply detecting a crack generated in plural semiconductor chips while the design freedom is improved, includes a first semiconductor chip and a second semiconductor chip that is laminated on the first semiconductor chip, in which a first wiring that is formed along the outer periphery of the first semiconductor chip and a second wiring that is formed along the outer periphery of the second semiconductor chip are connected in series.

8 Claims, 3 Drawing Sheets

SEMICONDUCTOR APPARATUS

FIELD OF THE INVENTION

The present invention relates to a semiconductor apparatus that is capable of detecting a crack generated in a semiconductor chip.

BACKGROUND OF THE INVENTION

In case of a semiconductor apparatus according to the related art, as shown in FIG. 2, a crack 120 may be generated on a semiconductor chip 110 due to stress that occurs during a cutting process, a mounting process, or a heating process.

JP-A-Hei6(1994)-244254, JP-A-2005-277338, and JP-A-2005-353815 disclose the solving means for the above-mentioned problem. The above documents disclose a semiconductor apparatus that is mounted on a package substrate.

Referring to FIG. 3, the package substrate 124 includes a plurality of terminals 126 that is provided along the outer periphery. Further, a semiconductor chip 110 includes plural electrode pads 112 that are provided along the outer periphery. The terminals 126 and the electrode pads 112 are connected to each other by a bonding wire 130.

The semiconductor chip 110 further includes a wiring 118 provided between the electrode pads 112 and the outer periphery of the semiconductor chip 110 to connect the adjacent first electrode pad 112a and second electrode pad 112b. The first electrode pads 112a of the semiconductor chip 110 and the first terminal 126a of the package substrate 124 are connected to each other by a bonding wire 130. Similarly, the second electrode pad 112b and the second terminal 126b are connected to each other by the bonding wire 130.

When a crack 120 is generated in the semiconductor chip 110, the wiring 118 is disconnected. In this case, a resistance between the first terminal 126a and the second terminal 126b is changed, which makes to enable to detect the crack 120.

Further, JP-A-Hei6(1994)-244254 discloses that both ends of a conductor pattern are convoluted to each other, and two measuring electrode pads connected at the both ends of the conductor pattern are formed at one edge.

SUMMARY

However, the semiconductor chip disclosed in JP-A-Hei6(1994)-244254, JP-A-2005-277338, and JP-A-2005-353815 does not consider laminating plural semiconductor chips. Therefore, when the semiconductor chips disclosed in JP-A-Hei6(1994)-244254, JP-A-2005-277338, and JP-A-2005-353815 are laminated, it is required to detect the generation of a crack for every semiconductor chip, which makes it complicated to check the semiconductor apparatus.

Further, the semiconductor chip disclosed in JP-A-Hei6(1994)-244254, JP-A-2005-277338, and JP-A-2005-353815 needs to use adjacent first and second electrode pads 112a and 112b as a detecting pad. Therefore, it is difficult to use a desired electrode pad when plural semiconductor chips is laminated, which limits the design freedom.

A semiconductor apparatus according to an aspect of the invention includes a first semiconductor chip; a second semiconductor chip that is laminated on the first semiconductor chip; plural first electrode pads formed on the first semiconductor chip; plural second electrode pads formed on the second semiconductor chip; a first wiring that is connected to two electrode pads, which are selected from the plural first electrode pads, and formed along the outer periphery of the first semiconductor chip; a second wiring that is connected to two electrode pads, which are selected from the plural second electrode pads, and formed along the outer periphery of the second semiconductor chip; and a third wiring that connects one of the first electrode pads connected to one end of the first wiring and one of the second electrode pads connected to one end of the second wiring, and connects the first wiring and the second wiring in series.

With this configuration according to the aspect of the invention, the first wiring of the first semiconductor chip and the second wiring of the second semiconductor chip are connected in series. Therefore, the crack generated in the first semiconductor chip or the second semiconductor chip can be easily detected at a time by measuring the resistance between the two electrode pads disposed at both ends of the wirings. As a result, it is possible to simple detect the crack generated in plural semiconductor chips.

With this configuration, since it is possible to draw the wiring at a predetermined location, it is possible to use two predetermined electrode pads that are arbitrarily selected from the plural electrode pads. Therefore, the design freedom of a semiconductor apparatus in which plural semiconductor chips is laminated can be improved.

According to the invention, it is possible to provide a semiconductor apparatus that is capable of simply detecting a crack generated in a semiconductor chip while the design freedom is improved.

DETAILED DESCRIPTION OF THE PREFERRED EMBODIMENTS

Figure 1:
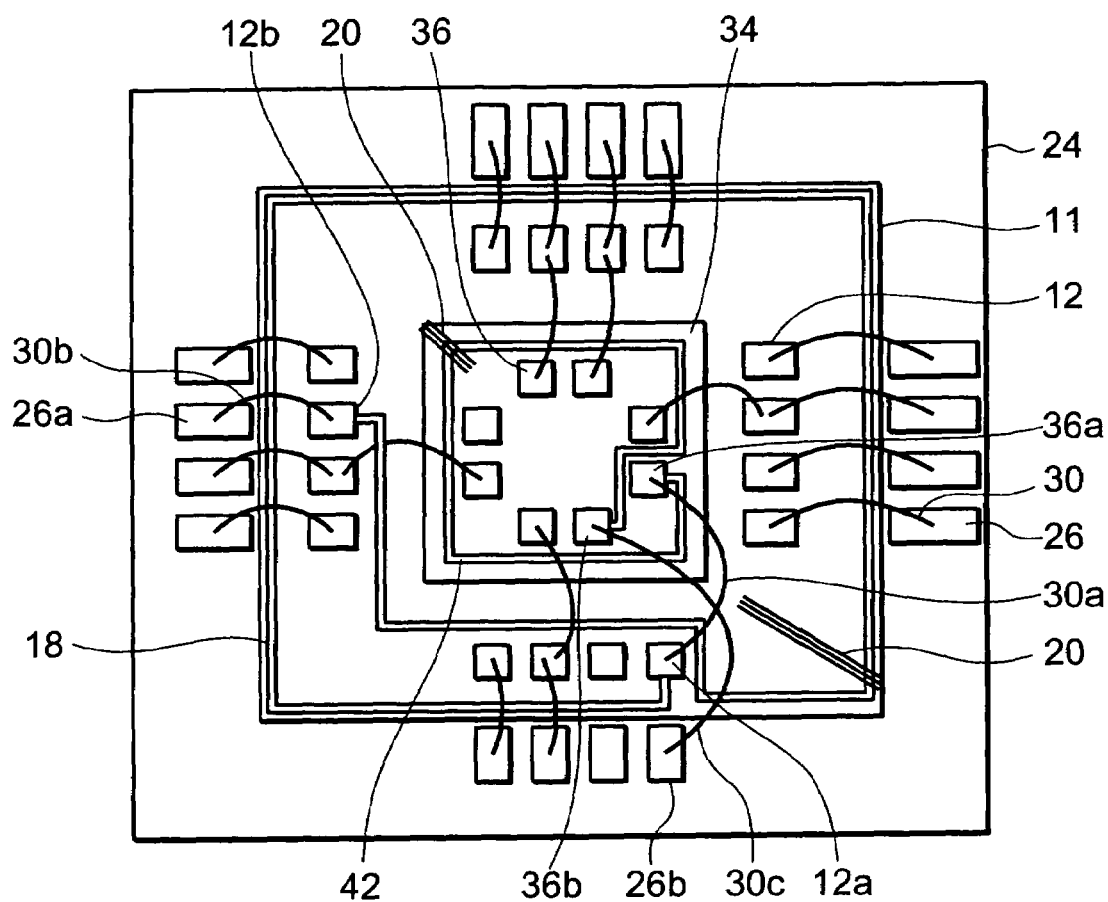
FIG. 1 is a schematic top view of a semiconductor apparatus according to an exemplary embodiment of the invention.
Figure 2:
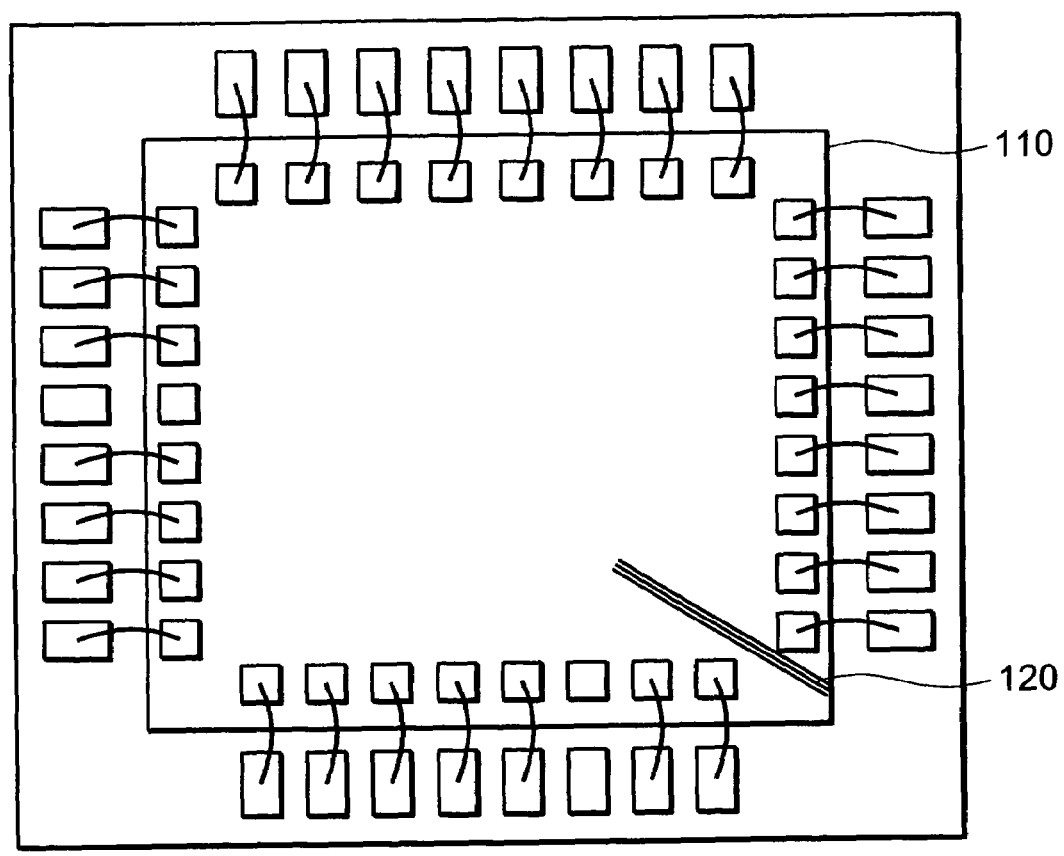
FIG. 2 is a schematic top view of a semiconductor apparatus according to the related art.
Figure 3:
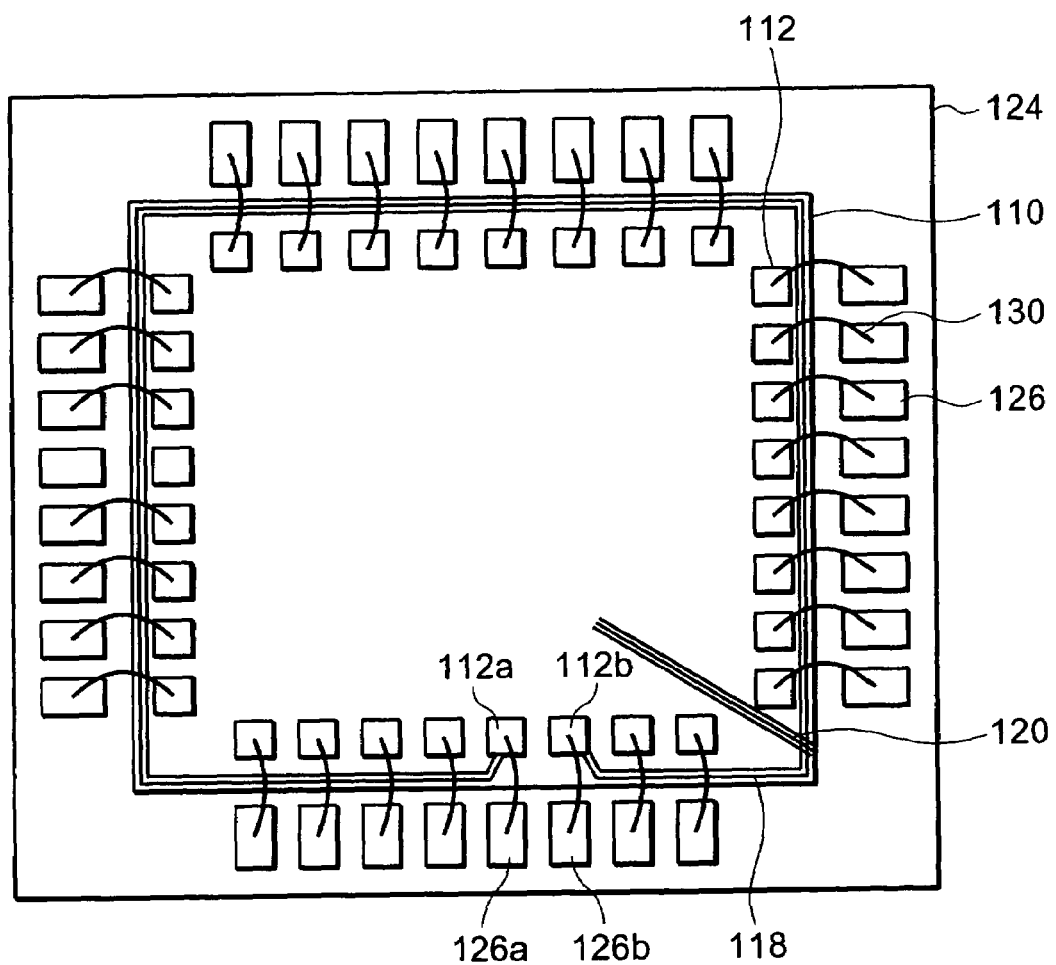
FIG. 3 is a schematic top view of a semiconductor apparatus according to the related art.

Hereinafter, exemplary embodiments of the invention will be described with reference to drawings. Like reference numerals designate like elements throughout the specification, and the description thereof will be omitted.

A semiconductor apparatus according to an exemplary embodiment will be described with reference to a schematic top view shown in FIG. 1.

As shown in FIG. 1, the semiconductor apparatus according to the embodiment of the invention includes a first semiconductor chip 11 and a second semiconductor chip 34 laminated on the first semiconductor chip 11 and is mounted on a package substrate 24. The package substrate 24 includes plural terminals 26 formed along the outer periphery on the top surface of the package substrate.

The first semiconductor chip 11 includes plural first electrode pads 12 formed along the outer periphery thereof and a first wiring 18.

The first wiring 18 is connected to two first electrode pads 12a and 12b that are arbitrarily selected from the plural first electrode pads 12, and disposed almost along the entire outer periphery of the first semiconductor chip 11 on the uppermost layer.

The first wiring 18 may contain a metal such as Al, Cu, and so forth. The width of the first wiring 18 may be larger than the width of the internal signal wiring.

The first electrode pads 12 are connected to an internal circuit of the first semiconductor chip 11, and include an electrically floated pad. The two first electrode pads 12a and 12b that are selected from the plural first electrode pads 12 are connected to the first wiring 18. The first electrode pads 12a and 12b are not inspection pads that are specifically made for inspection, but are arbitrarily selected from the above plurality of first electrode pads 12.

The first electrode pads 12a and 12b that are connected to the first wirings 18 are disposed at the different edges of the rectangular first semiconductor chip 11.

The first wiring 18 is wound at least one time along the outer periphery of the first semiconductor chip 11 on the uppermost layer of the first semiconductor chip 11. In this embodiment, the first wiring 18 has at least one overlapping part.

Therefore, when the crack is generated in the first semiconductor chip 11, the first wiring 18 between the two first electrode pads 12a and 12b is disconnected. Accordingly, the generation of the crack 20 can be checked by measuring a resistance between the two first electrode pads 12a and 12b.

The second semiconductor chip 34 includes plural second electrode pads 36 formed along the outer periphery thereof and a second wiring 42.

The second wiring 42 is connected to two second electrode pads 36a and 36b that are arbitrarily selected from the plural second electrode pads 36, and disposed almost along the entire outer periphery of the second semiconductor chip 34 on the uppermost layer.

The second wiring 42 may contain a metal such as Al, Cu, and so forth. The width of the second wiring 42 may be larger than the width of the internal signal wiring.

The second electrode pad 36 is an electrode pad that is connected to an internal circuit of the second semiconductor chip 34, and includes an electrically floated pad. The two second electrode pads 36a and 36b that are selected from the plural second electrode pads 36 are connected to the second wiring 42. The second electrode pads 36a and 36b are not inspection pads that are specifically made for inspection, but are arbitrarily selected from the above plurality of second electrode pads 36.

The two second electrode pads 36a and 36b that are connected to the second wirings 42 are disposed at the different edges of the rectangular second semiconductor chip 34.

The second wiring 42 is wound at least one time along the outer periphery of the second semiconductor chip 34 on the uppermost layer of the second semiconductor chip 34. This embodiment includes at least one location where parts of the second wiring 42 are parallel to each other.

Therefore, when the crack 20 is generated in the second semiconductor chip 34, the second wiring 42 between the two second electrode pads 36a and 36b is disconnected. Accordingly, the generation of the crack 20 can be checked by measuring a resistance between the two second electrode pads 36a and 36b.

The first electrode pad 12a of the first semiconductor chip 11 that is connected to the first wiring 18 and the second electrode pad 36a of the second semiconductor chip 34 that is connected to the second wiring 42 are electrically connected by a third wiring (a bonding wire 30a). With this configuration, the first wiring 18 and the second wiring 42 are connected in series to each other.

The first terminal 26a of the package substrate 24 is connected to the first electrode pad 12b of the first semiconductor chip 11 by a fourth wiring (a bonding wire 30b). The first electrode pad 12a of the first semiconductor chip 11 is connected to the second electrode pad 36a by the third wiring (the bonding wire 30a). Further, the second electrode pad 36b of the second semiconductor chip 34 is connected to the second terminal 26b on the package substrate 24 by a fifth wiring (a bonding wire 30c)

The effect of this embodiment will be described below.

According to this embodiment, the first electrode pad 12a connected to the first wiring 18 of the first semiconductor chip 11 is electrically connected to the second electrode pad 36a connected to the second wiring 42 of the second semiconductor chip 34 by the bonding wire 30a. Further, the first wiring 18 and the second wiring 42 are connected in series to each other.

The semiconductor apparatus according to the related art needs to separately measure every semiconductor chip in order to detect the generation of the crack of the semiconductor chip. Therefore, when the semiconductor chips are laminated, it is difficult to detect the generation of the crack.

In contrast, according to the semiconductor apparatus of the embodiment, the first wiring 18 and the second wiring 42 are connected in series to each other. Therefore, the crack 20 generated in the first semiconductor chip 11 or the second semiconductor chip 34 can be easily detected at a time by measuring the resistance between the first terminal 26a and the second terminal 26b that are connected to the first and second wirings.

Further, according to the embodiment, since it is possible to draw the wiring at a predetermined location, it is possible to use two predetermined electrode pads that are arbitrarily selected from the plural electrode pads. Therefore, the design freedom of a semiconductor apparatus in which plural semiconductor chips is laminated can be improved.

Further, any one of the first electrode pad 12b and the second electrode pad 36b may be connected to only the first wiring 18 or the second wiring 42.

That is, one end of the first wiring 18 or the second wiring 42 to which the electrode pad is not connected can be connected to a terminal (including pull-up/pull-down), such as VDD or GND, whose function is previously determined.

When the first electrode pad 12b and the second electrode pad 36b are electrically floated, it is required to apply a voltage between the electrode pads to confirm disconnection of the first wiring 18 or the second wiring 42. However, with this configuration, it is possible to detect the output of the first electrode pad 12b that is connected to only the first wiring 18 or the second electrode pad 36 that is connected to only the second wiring 42, which makes it possible to easily confirm disconnection of the first wiring 18 or the second wiring 42.

Even though the exemplary embodiments of the invention are described with reference to the drawings, the embodiments are illustrative in all aspects of the invention, and the various modifications or changes can be made.

According to the above embodiment, even though the first wiring 18 and the second wiring 42 are disposed on the uppermost layer, at least one of the first wiring 18 and the second wiring 42 may be disposed on a layer other than the uppermost layer.

Since the rates of expansion between the package substrate and the resin are different due to the intermittent thermal stress occurring when using the semiconductor apparatus, a warpage may be generated on the entire package. Since the warpage is significant at the corner, the influence on the wiring formed on the uppermost layer that is close to a mold layer becomes larger, for example, the stress is concentrated thereon and sliding of a metal wiring may occur.

However, in the semiconductor apparatus according to the related art as disclosed in the above Patent Documents, the wiring is installed on the single layer or the same layer. Further, it is difficult to distinguish between disconnection caused by the sliding of the metal wiring due to the temperature stress and the pellet crack.

In contrast, when at least one of the first wiring 18 and the second wiring 42 is disposed on a layer other than the uppermost layer, disconnection or sliding of the metal wiring caused by the migration or hillock of aluminum can be effectively prevented and disconnection or a short circuit can be prevented. As a result, it is possible to enhance the ability to precisely specify the cause of the malfunction of the semiconductor apparatus.

Further, when the first wiring 18 or the second wiring 42 is disposed on the lowermost layer of the first semiconductor chip 11 or the second semiconductor chip 34, a polysilicon resistance can be used.

The two first electrode pads 12*a* and 12*b* may be formed along the same edge of the rectangular first semiconductor chip 11, or be adjacent to each other. Furthermore, two second electrode pads 36*a* and 36*b* may be formed along the same edge of the rectangular second semiconductor chip 34, or be adjacent to each other.

According to this embodiment, the first semiconductor chip 11 and the second semiconductor chip 34 may be mounted in parallel to each other on the package substrate 24.

Further, the second semiconductor chip 34 and a third semiconductor chip may be mounted in parallel to each other on the first semiconductor chip 11. Further, the first semiconductor chip 11, the second semiconductor chip 34, and the third semiconductor chip may be sequentially mounted in this order. When using the third semiconductor chip, the wirings of the semiconductor chips may be connected in series by the electrode pads.

Although the inventions has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor apparatus comprising:
    a first semiconductor chip;
    a second semiconductor chip that is laminated on said first semiconductor chip;
    a plurality of first electrode pads formed on said first semiconductor chip;
    a plurality of second electrode pads formed on said second semiconductor chip;
    a first wiring that is coupled to two first electrode pads, which are selected from said plurality of first electrode pads, and formed along the outer periphery of said first semiconductor chip;
    a second wiring that is coupled to two second electrode pads, which are selected from the plurality of second electrode pads, and formed along the outer periphery of said second semiconductor chip; and
    a third wiring that is coupled to both one of said plurality of first electrode pads being coupled to one end of said first wiring and one of said plurality of second electrode pads being coupled to one end of said second wiring, and couples said first wiring and said second wiring in series.

2. The semiconductor apparatus according to claim 1, further comprising:
    a first terminal;
    a second terminal;
    a fourth wiring is coupled to both said first terminal and said first electrode pads to which the other end of said first wiring, and
    a fifth wiring is coupled to both said second terminal and said second electrode pads to which the other end of said second wiring.

3. The semiconductor apparatus according to claim 2, wherein said first semiconductor chip is mounted on a substrate that includes said first terminal and said second terminal.

4. The semiconductor apparatus according to claim 3, wherein said first wiring is formed along the outer peripheries of said first semiconductor chip one or more times, and
    said second wiring is formed along the outer peripheries of said second semiconductor chip one or more times.

5. The semiconductor apparatus according to claim 4, wherein at least one of said first wiring and said second wiring is formed on a layer other than the uppermost layer.

6. The semiconductor apparatus according to claim 5, wherein any one of the other electrode pad in the two electrode pads coupled to said first wiring and the other electrode pad in the two electrode pads coupled to said second wiring is coupled only to the corresponding wiring.

7. The semiconductor apparatus according to claim 6,
    wherein said two electrode pads that are coupled to said first wiring are formed along different edges of said first semiconductor chip, and
    wherein said two electrode pads that are coupled to said second wiring are formed along different edges of said second semiconductor chip.

8. The semiconductor apparatus according to claim 1,
    wherein a third semiconductor chip is laminated on said first semiconductor chip or said second semiconductor chip, and
    wherein a third wiring being formed along the outer periphery of said third semiconductor chips is coupled in series by said first electrode pads to which the other end of said first wiring or said second electrode pads to which the other end of said second wiring.

* * * * *